US010601309B2

(12) United States Patent
Bonnefous et al.

(10) Patent No.: US 10,601,309 B2
(45) Date of Patent: Mar. 24, 2020

(54) DEVICE FOR TRANSFORMING AND FOR RECTIFYING POLYPHASE VOLTAGE

(71) Applicant: ZODIAC AERO ELECTRIC, Montreuil (FR)

(72) Inventors: Edouard Bonnefous, Montreuil (FR); Arnaud Badault, Montreuil (FR)

(73) Assignee: ZODIAC AERO ELECTRIC, Montreuil (FR)

( * ) Notice: Subject to any disclaimer, the term of this patent is extended or adjusted under 35 U.S.C. 154(b) by 0 days.

(21) Appl. No.: 16/452,275

(22) Filed: Jun. 25, 2019

(65) Prior Publication Data

US 2019/0393774 A1 Dec. 26, 2019

(30) Foreign Application Priority Data

Jun. 26, 2018 (FR) ...................................... 18 55697

(51) Int. Cl.
| | | |
|---|---|---|
| *H02M 1/42* | (2007.01) | |
| *B64D 41/00* | (2006.01) | |
| *H02M 7/06* | (2006.01) | |
| *H01F 30/12* | (2006.01) | |

(52) U.S. Cl.
CPC .......... *H02M 1/4216* (2013.01); *B64D 41/00* (2013.01); *H01F 30/12* (2013.01); *H02M 7/068* (2013.01)

(58) Field of Classification Search
CPC ..... H02M 1/4216; H02M 7/068; H01F 30/12; B64D 41/00
See application file for complete search history.

(56) References Cited

U.S. PATENT DOCUMENTS

| | | |
|---|---|---|
| 9,230,726 B1 | 1/2016 | Parker et al. |
| 2006/0087812 A1 | 4/2006 | Meyer |
| 2012/0236498 A1 | 9/2012 | Pal et al. |
| 2015/0049436 A1 | 2/2015 | Wu et al. |
| 2015/0171674 A1* | 6/2015 | Lee .................. H02K 1/246 318/724 |
| 2018/0174731 A1 | 6/2018 | Fukuchi et al. |

FOREIGN PATENT DOCUMENTS

| | | |
|---|---|---|
| DE | 10 2005 031 759 A1 | 1/2007 |
| DE | 11 2016 003 428 T5 | 5/2018 |
| EP | 2 229 044 A2 | 9/2010 |
| EP | 2 229 044 A3 | 10/2010 |
| WO | 2011/130944 A1 | 10/2011 |

OTHER PUBLICATIONS

Search Report dated May 8, 2019, issued in priority French Application No. 1855697, filed Jun. 26, 2018, 2 pages.

* cited by examiner

*Primary Examiner* — Adolf D Berhane
*Assistant Examiner* — Afework S Demisse
(74) *Attorney, Agent, or Firm* — Christensen O'Connor Johnson Kindness PLLC (57) ABSTRACT

Device for transforming and for rectifying polyphase, in particular three-phase, voltage comprising a polyphase transformer comprising a voided central zone, a voltage rectifier circuit that is connected to the transformer and a fan. The voltage rectifier circuit includes at least three heat dissipation units forming a right prism of regular polygonal section comprising a voided central zone, the transformer, the voltage rectifier circuit and the fan being positioned such that at least some of the airflow produced by the fan flows through the voided central zone of the rectifier so as to immerse the transformer.

13 Claims, 9 Drawing Sheets

DEVICE FOR TRANSFORMING AND FOR RECTIFYING POLYPHASE VOLTAGE

CROSS-REFERENCE TO RELATED APPLICATIONS

The present disclosure claims priority to French Patent Application No. 1855697, filed on Jun. 26, 2018, the content of which is incorporated herein by reference in its entirety.

FIELD OF INVENTION

The present invention relates to energy conversion devices and, more particularly, to devices for transforming and for rectifying a polyphase voltage.

The invention relates more particularly to a device for transforming and for rectifying a voltage which is fitted to aircraft and known to those skilled in the art by the acronym TRU, for transformer rectifier unit.

BACKGROUND

Figure 1:
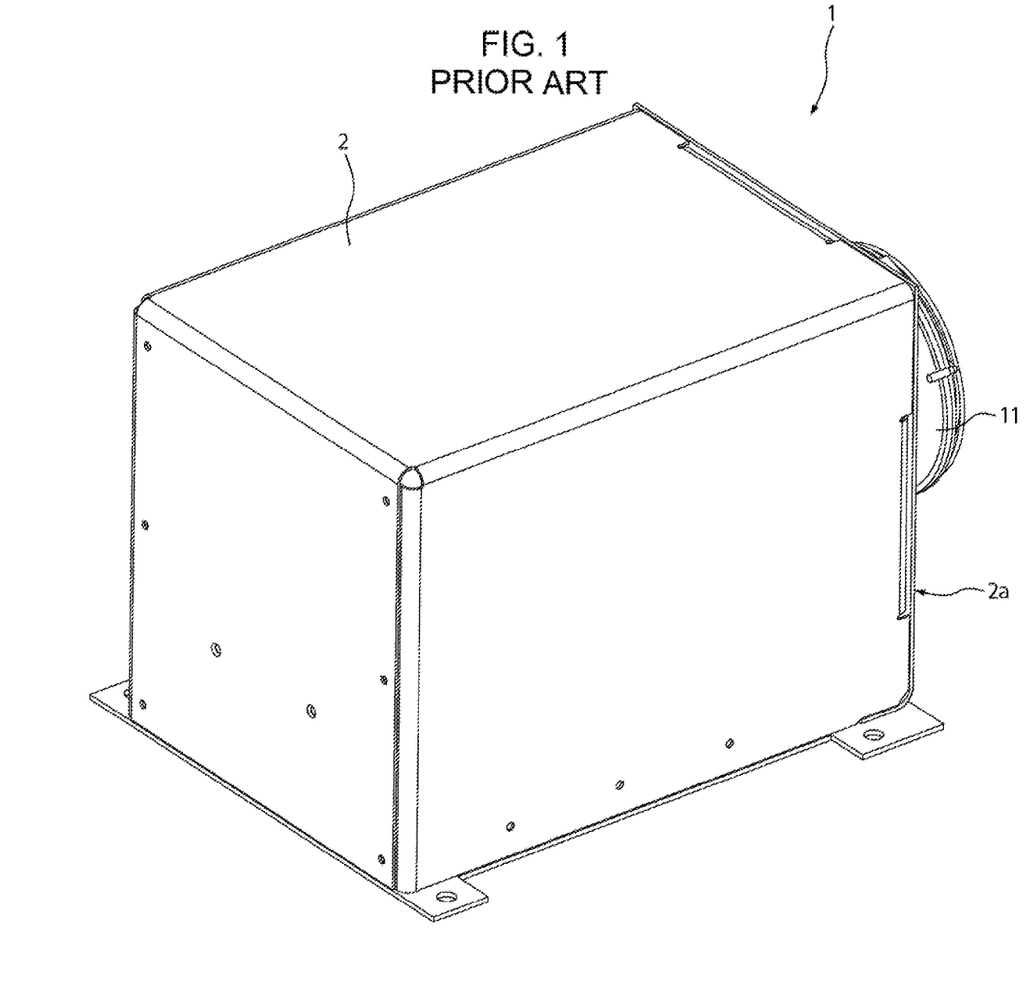
FIGS. 1 and 2, of which mention has already been made, schematically illustrate a device for transforming and for rectifying a polyphase voltage according to the prior art.
Figure 2:
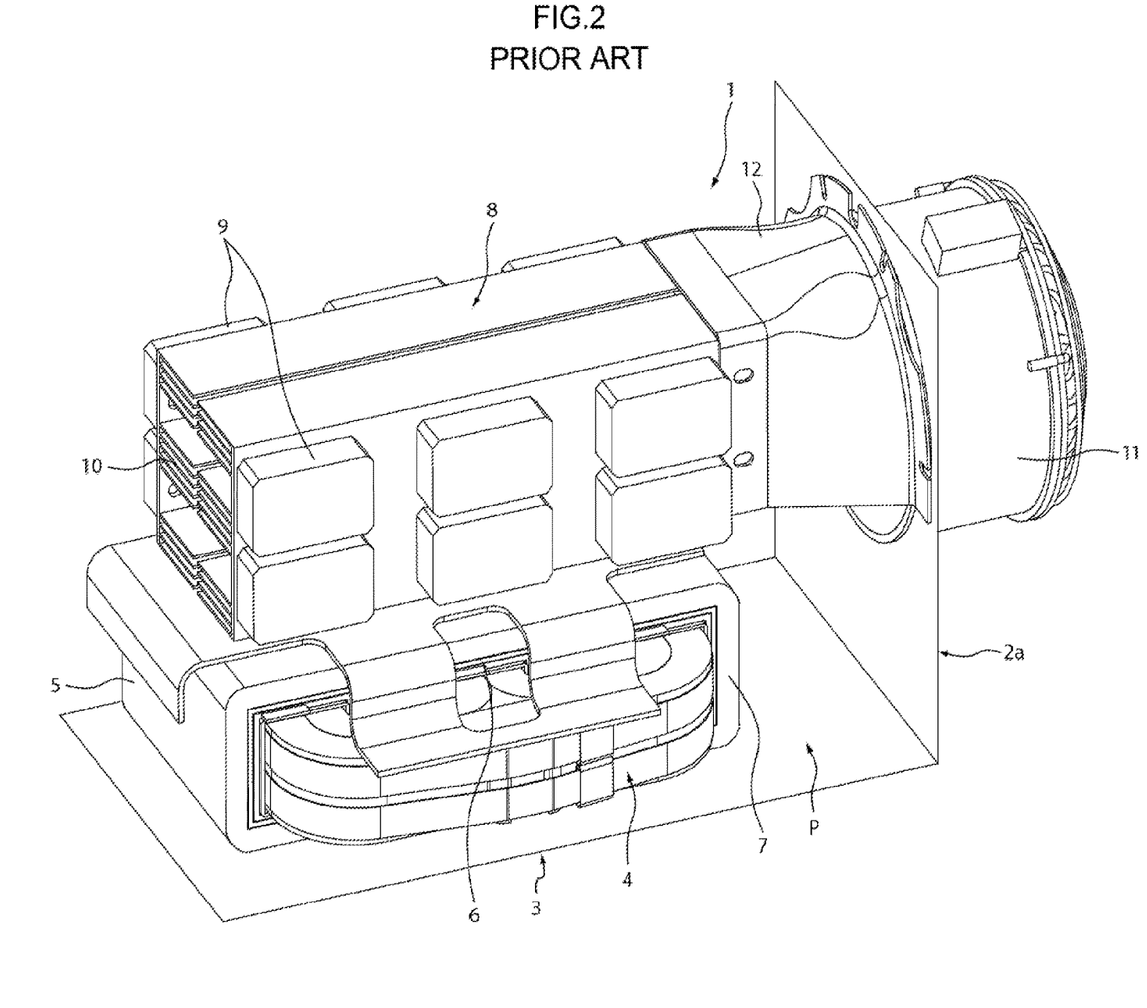

FIGS. 1 and 2 schematically depict a device 1 for transforming and for rectifying a three-phase voltage.

The device 1 comprises a rectifier circuit, comprising rectifier diodes 9 and a heat dissipation radiator 8, and a three-phase transformer 3 comprising a magnetic circuit 4 and three windings 5, 6 and 7. The overall assembly is mounted in a housing 2 provided with a baseplate P.

The radiator 8 is provided with fins 10 and dissipates the heat generated by the diodes 9.

The device 1 further comprises a fan 11 that is attached to one face 2a of the housing 2 comprising a frontal opening. The fan is capable of producing a cooling airflow flowing into the housing 2 such that some of the airflow flows through the cooling circuits between the fins 10 of the cooling radiator 8 so as to cool in particular the diodes 9.

However, despite the advantages afforded by this device, the components of the device are not cooled entirely satisfactory and there is a need to decrease the weight and the volume of said device still further.

The aim of the invention is therefore to improve the cooling of a device for transforming and rectifying polyphase voltage according to the prior art without increasing either the volume or the weight of the device.

In light of the above, the invention proposes a device for transforming and for rectifying polyphase voltage comprising a polyphase, in particular three-phase, transformer, comprising a voided central zone, a voltage rectifier circuit that is connected to the transformer and a fan.

The voltage rectifier circuit includes at least three heat dissipation units forming a right prism of regular polygonal section comprising a voided central zone. The transformer, the voltage rectifier circuit and the fan being positioned such that at least some of the airflow produced by the fan flows through the voided central zone of the rectifier so as to immerse the transformer.

According to another feature, directrix axes of the fan, of the rectifier circuit and of the transformer are parallel to, or even aligned with, one and the same axis such that the airflow is channelled by the rectifier circuit.

Advantageously, the peripheral face of the transformer and that of the rectifier circuit lie within parallel, or even coplanar, planes.

Preferably, a first diffuser is placed between the fan and the rectifier circuit, a first end of the diffuser bordering the fan and a second end of the diffuser making contact with the rectifier circuit, the sections of the first and second ends of the diffuser being substantially identical to those of the fan and of the rectifier circuit, respectively, so as to channel the airflow into the rectifier circuit.

Preferably, the fan includes a useful zone that is for blowing the airflow and a dead zone that is not for blowing said airflow, the device further comprising a channelling device, the dimensions of which are substantially equal to the dimensions of the dead zone so as to guide the airflow towards the rectifier circuit around the dead zone.

According to another feature, the transformer and rectifier device further comprises a second diffuser that is arranged around the transformer so as to channel, around the transformer, at least some of the airflow that does not flow through the voided central zone of the rectifier and through that of the transformer.

According to another feature, at least one heat dissipation unit comprises a heat dissipation radiator, one face of which comprises fins, in particular arranged in the voided central zone of the rectifier circuit, and rectifier diodes that are arranged on the face opposite that comprising the fins.

Advantageously, the polyphase transformer comprises a magnetic circuit forming a right prism of regular polygonal section, in particular a triangle-based right prism, a star-based right prism or a hexagon-based right prism.

Preferably, the magnetic circuit includes a plurality of magnetic elements passing through one or more coils, each magnetic element forming a closed loop passing substantially through the edges of the right prism.

Advantageously, the number of magnetic elements is a multiple of three.

According to a first embodiment, the device for transforming and for rectifying polyphase voltage further comprises airflow outlet holes that are arranged such that the airflow produced by the fan flows through the rectifier circuit and the transformer before exiting via said holes.

DESCRIPTION OF THE DRAWINGS

What is proposed, according to another aspect, is an aircraft comprising at least one device for transforming and for rectifying a polyphase voltage such as described above and a housing incorporating said device.

Other objects, features and advantages of the invention will become apparent on reading the following description, which is given solely by way of a non-limiting example and with reference to the appended drawings, in which.

DETAILED DESCRIPTION

Figure 3:
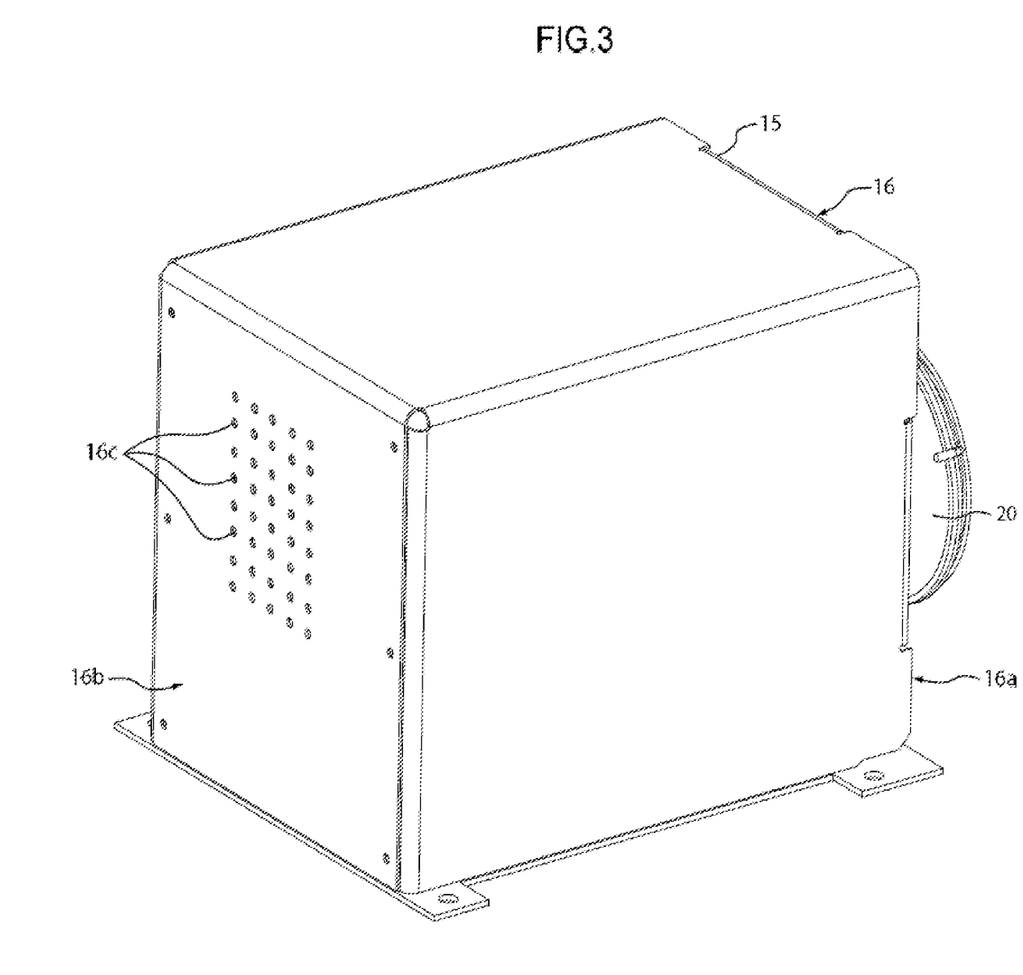
FIGS. 3, 4, 5 and 5a illustrate a first embodiment of a device for transforming and for rectifying polyphase voltage according to the invention.
Figure 4:
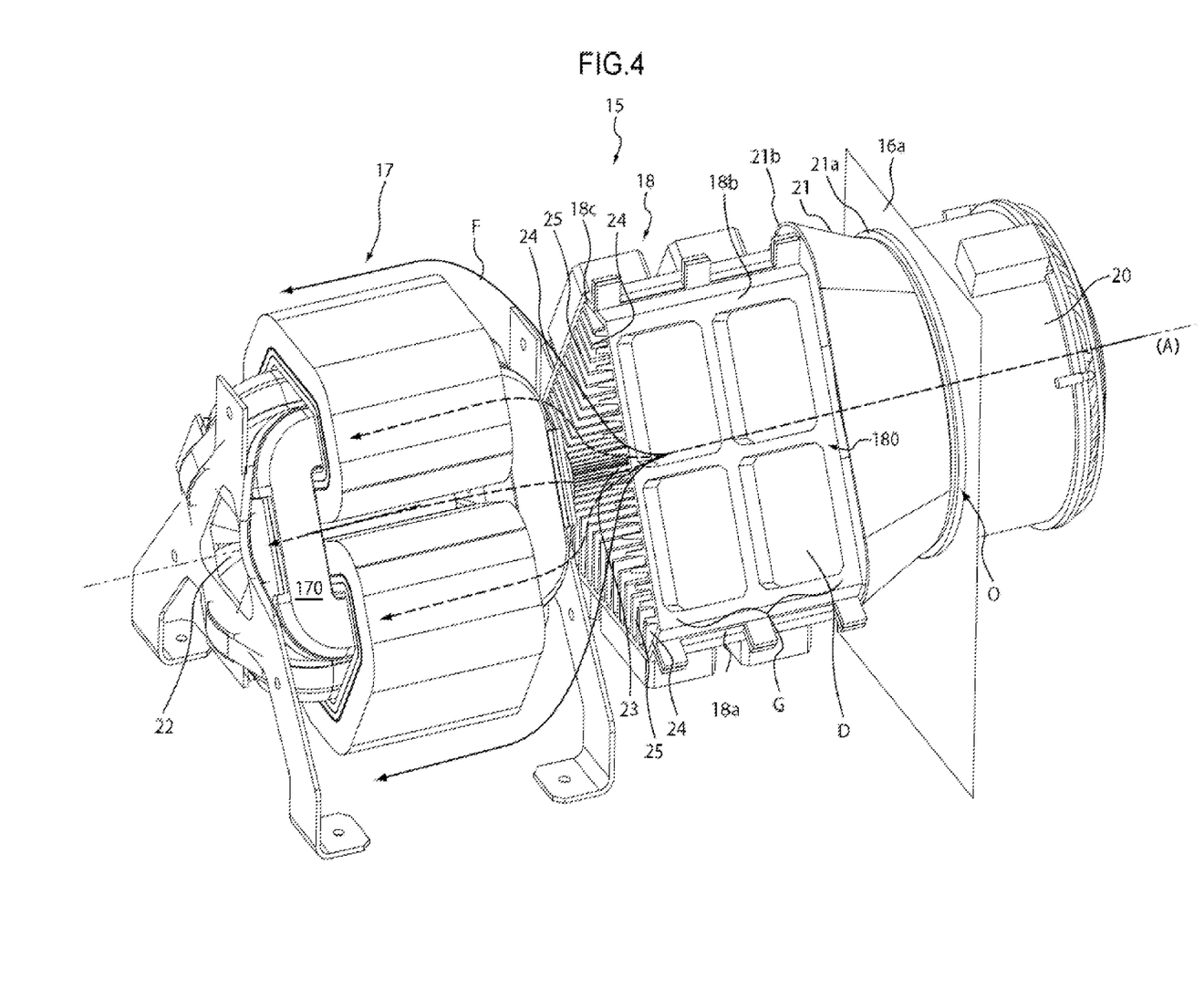
Figure 5:
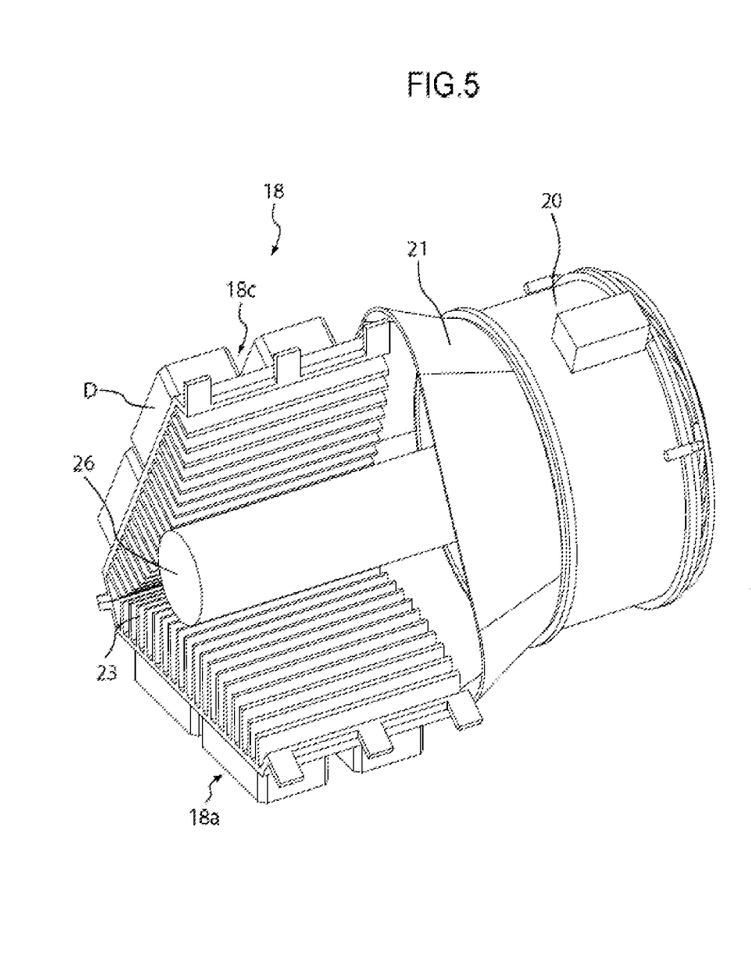

Reference is made to FIGS. 3, 4 and 5, which illustrate a first embodiment of a device 15 for transforming and for rectifying polyphase voltage. This device is placed in a housing 16 having the same dimensions as, or smaller dimensions than, those of the housing 2 according to the prior art.

The device 15 comprises a polyphase transformer 17 comprising a voided central zone and a three-phase-voltage rectifier circuit 18 that is electrically connected to the transformer.

Hereinafter, the transformer 17 is a three-phase transformer also comprising a voided central zone 22.

According to a first preferred embodiment, the three-phase transformer 17 comprises a magnetic circuit forming a right prism of regular polygonal section. The number of sides of the right prism of polygonal section is a multiple of three. As shown, the magnetic circuit may comprise a triangle-based right prism.

The magnetic circuit includes a plurality of magnetic elements passing through one or more coils, the magnetic elements each forming a closed loop passing substantially through an edge of the prism.

The number of magnetic elements is a multiple of three.

The voltage rectifier circuit 18 is formed on the basis of diodes D. As a variant, the rectifier function may be implemented by means of transistors or thyristors or by means of other semiconductor components.

As illustrated, the rectifier circuit includes rectifier modules, each comprising a bridge of rectifier elements, here four diodes, which are mounted on a heat dissipation unit. The rectifier circuit includes for example identical heat dissipation units 18a, 18b and 18c that are arranged so as to form a right prism of polygonal section comprising a voided central zone 23 through which the cooling airflow flows.

As illustrated in FIGS. 4 and 5, the rectifier circuit comprises three heat dissipation units 18a, 18b and 18c that are arranged so as to form a right prism of, in particular equilateral, triangular section comprising the voided central zone 23.

Figure 5A:
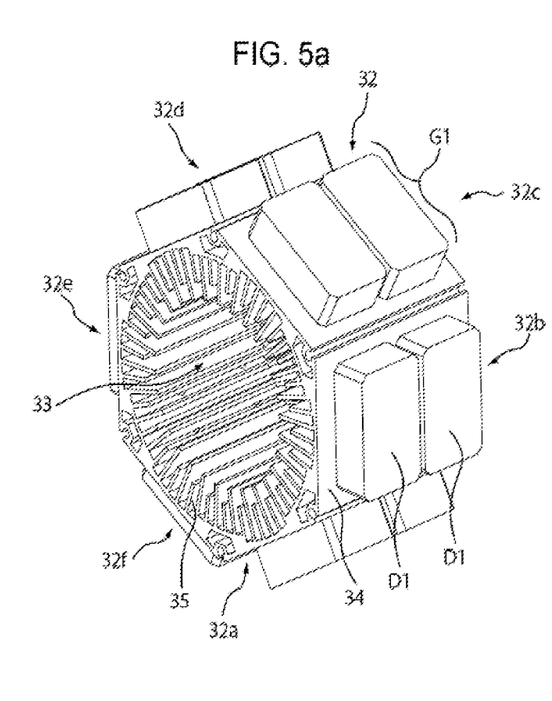

As a variant, in the embodiment of FIG. 5a, the three-phase-voltage rectifier circuit 32 comprises six identical heat dissipation units 32a, 32b, 32c, 32d, 32e and 32f that are arranged so as to form a right prism of regular hexagonal section. The device 15 comprises a rectifier circuit 32 comprising a voided central zone 33, the outer shape of which is substantially hexagonal and the inner shape of which is substantially circular.

Each unit 18a, 18b and 18c comprises fins 25 that are distributed on a face of the radiator opposite the rectifier diodes D. Each unit may have the same number of rectifier diodes.

Each fin 25 guides some of the heat from the heat dissipator. The fins 25 are each facing the airflow produced by the fan 20 for the purpose of being cooled. In other words, the fins 25 are arranged in the voided central zone 23 of the rectifier circuit 18.

According to another embodiment (not shown), the rectifier diodes D are arranged inside the voided central zone 23 and the fins 25 of the radiators 24 are arranged on the faces opposite the voided central zone.

The fins 25 may be distributed uniformly over the radiator 24 so as to increase the heat exchange area.

The fins may be obtained by extrusion and machining.

The profile of each fin may be an isosceles trapezium, the smallest base of which is free, thus facilitating extrusion operations.

As a variant, the profile of each fin is rectangular or corrugated.

A fan 20 is attached to a first side 16a of the housing 16, preferably to the outside thereof. In the zone for mounting the fan 20, the housing is provided with an axial opening O, which is preferably coaxial with the transformer 17 and with the rectifier circuit 18 so that the airflow produced by the fan enters the housing 16.

On the opposite side 16b, the housing comprises air outlet holes 16c that are arranged and collectively sized such that the airflow produced by the fan 20 passes through the rectifier circuit 18 and the transformer 17 before exiting the housing via the holes 16c.

A first diffuser 21 channelling the airflow may be attached to the inner face on the side 16a of the housing such that the airflow is channelled into the housing.

The first diffuser 21 may comprise fins for correcting the airflow (not shown).

The first diffuser 21 is placed between the fan 20 and the rectifier circuit 18, a first end 21a of the diffuser bordering the fan 20 and a second end 21b making contact with the rectifier circuit 18.

The section of the first end 21a of the first diffuser is substantially identical to that of the fan and the section of the second end 21b of the first diffuser is substantially identical to that of the rectifier circuit so as to channel the airflow into the rectifier circuit.

At least some, or even the majority or all of the airflow produced by the fan 20 is directed to the rectifier circuit 18. In the embodiment of FIGS. 3 to 5, by virtue of the diffuser 21, the entirety of the airflow is directed to the rectifier circuit 18. However, the housing 16 may be without a diffuser 21.

The transformer 17, the voltage rectifier circuit 18 and the fan 20 are positioned such that at least some of the airflow produced by the fan flows through the voided central zone 23 of the rectifier so as to immerse the transformer, the airflow arising from the fan 20 flowing through the central zone of the transformer and around the latter (arrow F).

The directrix axes of the fan 20, of the rectifier circuit 18 and of the transformer 17 are substantially parallel to, or even aligned with, one and the same axis (A) such that the airflow is channelled by the rectifier circuit.

The transformer 17 and the rectifier circuit 18 have peripheral faces, such as the faces 170 and 180, which are within parallel, or substantially coplanar, planes. The term "peripheral face" is understood to mean a face not facing the voided zone and through which said voided zone does not pass.

The directrix axis of the fan 20 is substantially aligned with the axis of rotation of the fan.

The directrix axis of the fan 20, of the rectifier circuit and of the transformer 17 is collinear with the directrix axis of the voided zones. Said directrix axis is substantially aligned with the axis of rotation of said fan.

According to another embodiment that can be seen in FIG. 5, the device 15 is supplemented by a deflector device 26.

The fan 20 comprises a useful zone that is for blowing the airflow and a dead zone that is not for blowing said airflow.

The dimensions of the deflector device 26 are substantially equal to the dimensions of the dead zone and it lies axially in this zone so as to guide the airflow towards the useful zone.

Consequently, the airflow is forced to pass through the voided central zone closer to the fins 25 of the sink.

The deflector device 26 may be cylindrical, as shown, or it may match the triangular shape of the fins and be profiled at its end.

The device may be attached to the dead zone of the fan as shown here. It may also, as a variant, be connected by fins to the diffuser 21 so as to correct the flow from the fan which tends to eddy.

Figure 6:
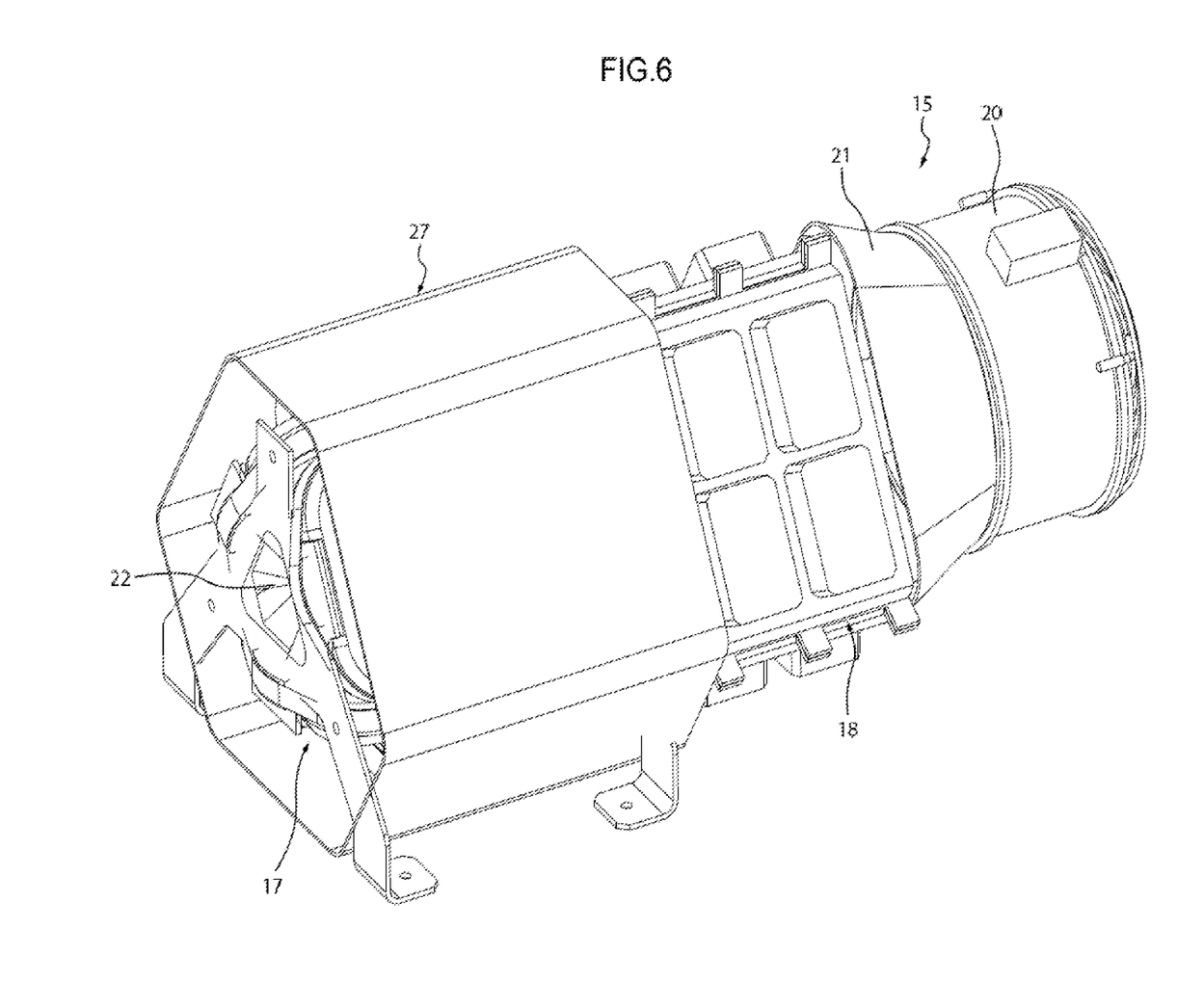
FIG. 6 illustrates a second embodiment of a device for transforming and for rectifying polyphase voltage according to the invention.

According to another embodiment shown in FIG. 6, the device 15 may comprise a second diffuser 27 that is arranged around the transformer so as to channel, around the transformer, the portion of the airflow that does not flow through the voided central zone 22 of the rectifier.

Figure 7:
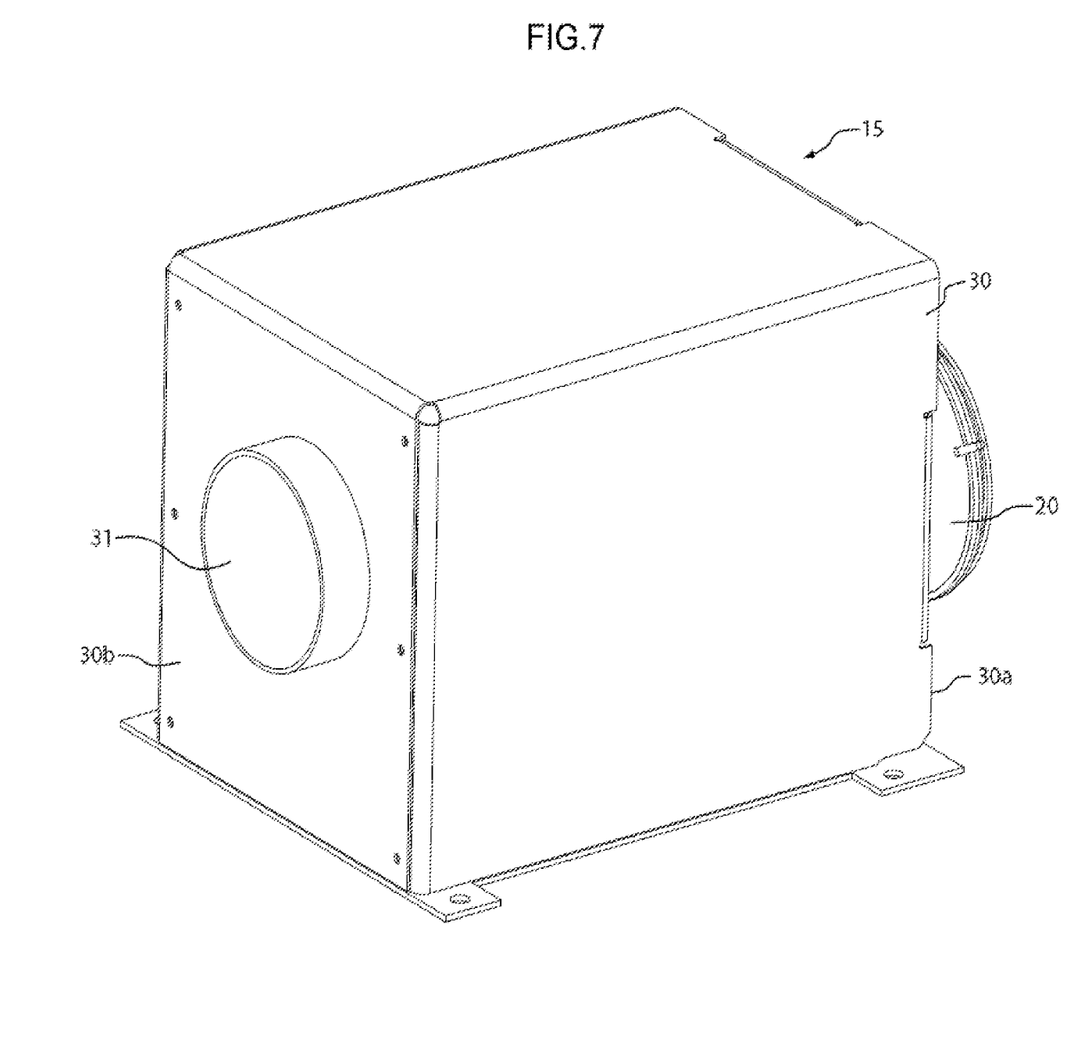
FIG. 7 illustrates another embodiment of the device according to the invention incorporated within a housing.

In the embodiment of FIG. 7, the housing 30, which is otherwise identical to the embodiment described above and to its variants, comprises a second fan 31 that is capable of extracting the air arising from the fan 20.

The second fan 31 is attached to the side 30b of the housing opposite the side 30a of the housing 30 on which the first fan 20 is mounted.

On this side 30b, the housing comprises an opening such that the airflow produced by the first fan 20 is extracted from the housing 30 by the second fan 31.

This opening may be replaced by air outlet holes as shown in the first embodiment of FIG. 3.

The second fan 31 may be inside or outside the housing 30.

Figure 8:
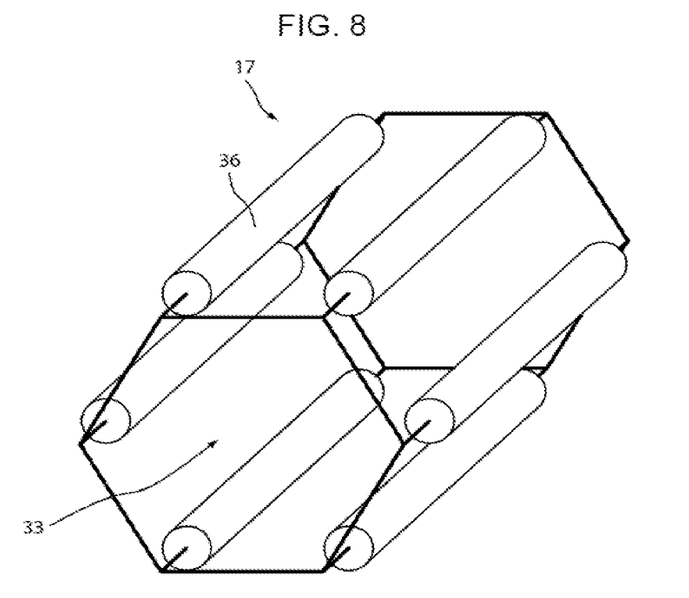
FIG. 8 illustrates a second embodiment of a polyphase transformer.
Figure 9:
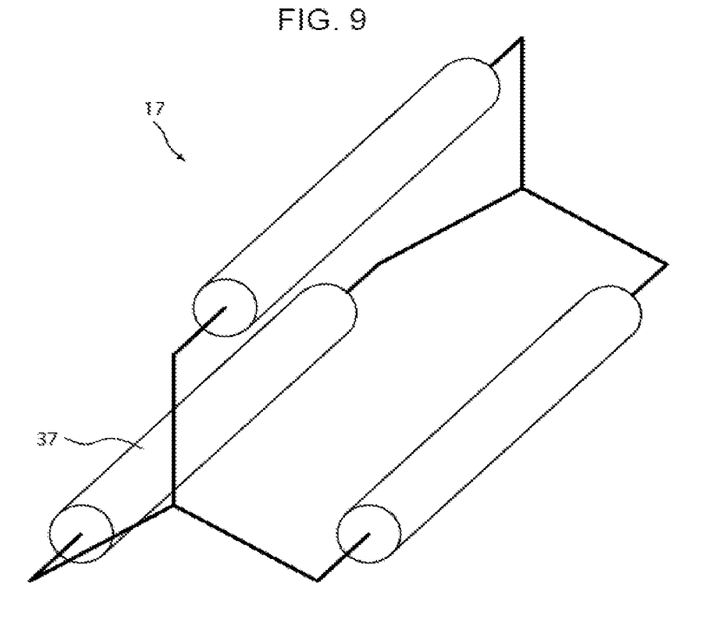
FIG. 9 illustrates a third embodiment of a polyphase transformer.

Reference is made to FIGS. 8 and 9 which illustrate embodiments of the transformer 17.

FIG. 8 schematically illustrates a second embodiment of the transformer 17 comprising a magnetic circuit forming a hexagon-based right prism.

The windings 36 of the transformer 17 are arranged on the edges of the hexagon.

In the embodiment of FIG. 9, a magnetic circuit forms a star-based right prism, here with three branches, on each of which a winding 37 of the transformer 17 is arranged.

Advantageously, the described embodiments of the transformer 17 are each lighter in weight than the transformer according to the prior art incorporated within a device for transforming and for rectifying three-phase voltage.

Consequently, for the same electrical characteristics, the device according to the invention is lighter in weight than a device for transforming and for rectifying three-phase voltage known from the prior art.

Figure 10:
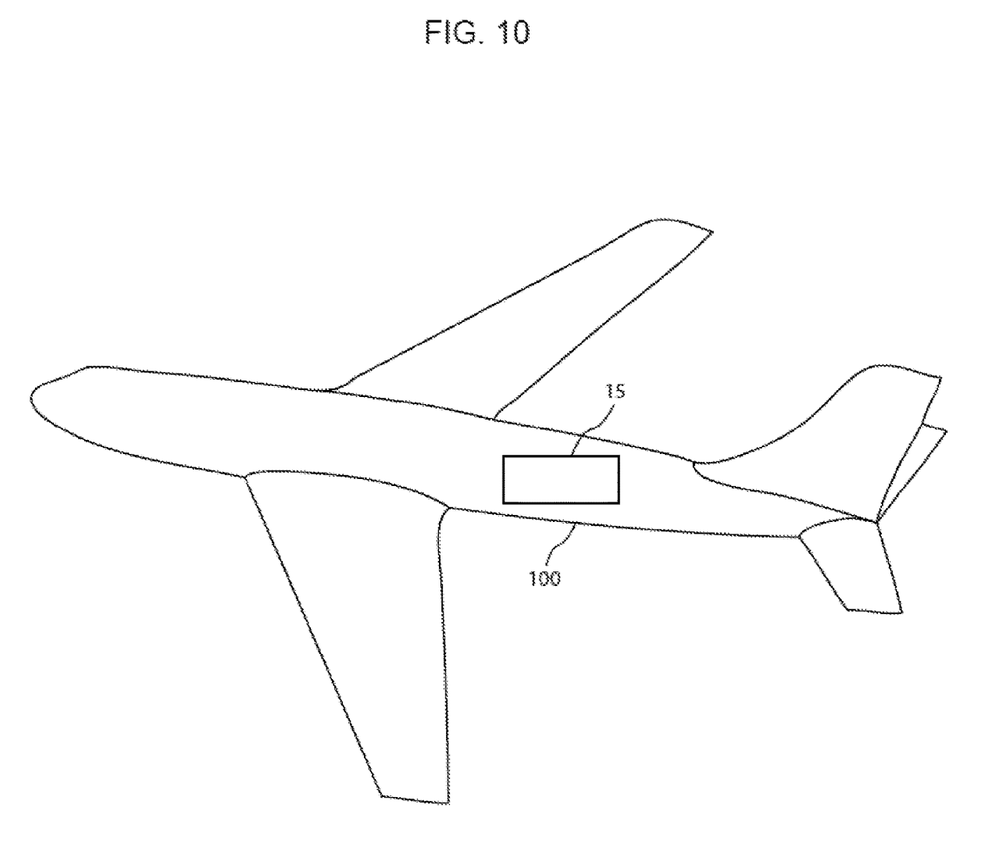
FIG. 10 illustrates an aircraft comprising the device for transforming and for rectifying polyphase voltage.

As shown in FIG. 10, such a device may advantageously be incorporated on board an aircraft 100.

The characteristics of the fan, notably the airflow rate, the voided central zone of the transformer and that of the rectifier circuit are sized such that, for a given electrical power transformed by the device, the thermal dissipation of the heat generated by the transformer and the rectifier diodes is sufficient for each component in the housing to keep to a temperature below its maximum operating temperature.

The use of a prismatic three-phase transformer and the arrangement of the transformer, of the rectifier circuit, of the diffuser and of the fan improve the movement of the airflow by freeing space within the housing.

Consequently, the differences in temperature between hot and cold points are decreased, the cooling of the components inside the housing is improved and the trade-off between meeting space and weight constraints and the capacity for cooling the components arranged within the housing is improved.

What is claimed is:

1. A device for transforming and for rectifying polyphase voltage comprising a polyphase transformer comprising a voided central zone, a voltage rectifier circuit that is connected to the transformer and a fan, wherein the voltage rectifier circuit includes at least three heat dissipation units forming a right prism of regular polygonal section having a voided central zone, wherein the transformer, the voltage rectifier circuit and the fan are positioned such that at least some of the airflow produced by the fan flows through the voided central zone of the rectifier so as to immerse the transformer.

2. The device for transforming and for rectifying polyphase voltage according to claim 1, wherein directrix axes of the fan, of the rectifier circuit and of the transformer are parallel to or aligned with one and the same axis (A, B) such that the airflow is channelled by the rectifier circuit.

3. The device for transforming and for rectifying polyphase voltage according to claim 1, wherein the peripheral face of the transformer and that of the rectifier circuit are parallel or coplanar, planes.

4. The device for transforming and for rectifying polyphase voltage according to claim 1, further comprising a first diffuser placed between the fan and the rectifier circuit, a first end of the diffuser bordering the fan and a second end of the diffuser making contact with the rectifier circuit, the sections of the first and second ends of the diffuser being substantially identical to those of the fan and of the rectifier circuit, respectively, so as to channel the airflow into the rectifier circuit.

5. The device for transforming and for rectifying polyphase voltage according to claim 1, wherein the fan includes a useful zone that is for blowing the airflow and a dead zone that is not for blowing said airflow, said device further comprising a channelling device, the dimensions of which are substantially equal to the dimensions of the dead zone so as to guide the airflow towards the rectifier circuit around the dead zone.

6. The device for transforming and for rectifying polyphase voltage according to claim 1, further comprising a second diffuser that is arranged around the transformer so as to channel, around the transformer, the portion of the airflow that does not flow through the voided central zone of the rectifier and through that of the transformer.

7. The device for transforming and for rectifying polyphase voltage according to claim 1, wherein at least one heat dissipation unit comprises a heat dissipation radiator, wherein one face of the heat dissipation radiator comprises fins that are arranged in the voided central zone of the rectifier circuit, and rectifier diodes (D, D1) that are arranged on the face opposite that comprising the fins.

8. The device for transforming and for rectifying polyphase voltage according to claim 1, wherein the polyphase transformer comprises a magnetic circuit forming a right prism of regular polygonal section that is a triangle-based right prism, a star-based right prism or a hexagon-based right prism.

9. The device for transforming and for rectifying polyphase voltage according to claim 8, wherein the magnetic circuit includes a plurality of magnetic elements passing through one or more coils, each magnetic element forming a closed loop passing substantially through the edges of the prism.

10. The device for transforming and for rectifying polyphase voltage according to claim 9, wherein the number of magnetic elements is a multiple of three.

11. The device for transforming and for rectifying polyphase voltage according to claim 1, further comprising a housing including airflow outlet holes that are arranged such that the airflow produced by the fan flows through the rectifier circuit and the transformer before exiting via said holes.

12. An aircraft comprising at least one device for transforming and for rectifying polyphase voltage according to claim 1.

13. The device for transforming and for rectifying polyphase voltage according to claim 1, wherein the polyphase voltage is a three-phase voltage.

* * * * *